United States Patent
Vidal-Dho et al.

(10) Patent No.: US 11,493,470 B2
(45) Date of Patent: Nov. 8, 2022

(54) METHOD FOR DETECTING MOISTURE IN AN INTEGRATED CIRCUIT, AND ASSOCIATED INTEGRATED CIRCUIT

(71) Applicant: STMicroelectronics (Rousset) SAS, Rousset (FR)

(72) Inventors: Matthias Vidal-Dho, Trets (FR); Quentin Hubert, Marseilles (FR); Pascal Fornara, Pourrieres (FR)

(73) Assignee: STMicroelectronics (Rousset) SAS, Rousset (FR)

(*) Notice: Subject to any disclaimer, the term of this patent is extended or adjusted under 35 U.S.C. 154(b) by 22 days.

(21) Appl. No.: 16/928,551

(22) Filed: Jul. 14, 2020

(65) Prior Publication Data

US 2021/0018458 A1 Jan. 21, 2021

(30) Foreign Application Priority Data

Jul. 19, 2019 (FR) ..................................... 1908238

(51) Int. Cl.
*G01N 27/22* (2006.01)
*G01N 27/12* (2006.01)
*H01L 23/00* (2006.01)

(52) U.S. Cl.
CPC ......... *G01N 27/223* (2013.01); *G01N 27/121* (2013.01); *H01L 23/564* (2013.01)

(58) Field of Classification Search
CPC .. G01N 27/048; G01N 27/121; G01N 27/223; H01L 23/564
See application file for complete search history.

(56) References Cited

U.S. PATENT DOCUMENTS

| | | | | |
|---|---|---|---|---|
| 6,833,720 B1* | 12/2004 | Daubenspeck | ....... | H01L 23/564 324/750.16 |
| 7,571,637 B2* | 8/2009 | Chen | ..................... | G01N 27/223 73/73 |
| 9,027,400 B2* | 5/2015 | Le Neel | ............... | G01N 27/223 73/335.04 |
| 10,126,260 B2* | 11/2018 | Chen | .................. | G01R 27/2605 |

(Continued)

FOREIGN PATENT DOCUMENTS

DE 102017215533 A1 3/2019
EP 2259319 A1 12/2010

(Continued)

OTHER PUBLICATIONS

INPI Search Report and Written Opinion for FR 1908238 dated Mar. 13, 2020 (9 pages).

*Primary Examiner* — Nimeshkumar D Patel
*Assistant Examiner* — Jean F Morello
(74) *Attorney, Agent, or Firm* — Crowe & Dunlevy (57) ABSTRACT

Moisture that is possibly present in an integrated circuit is detected autonomously by the integrated circuit itself. An interconnect region of the integrated circuit includes a metal level with a first track and a second track which are separated by a dielectric material. A detection circuit applies a potential difference between the first and second tracks. A current circulating in one of the first and second tracks in response to the potential difference is measured and compared to a threshold. If the current exceeds the threshold, this is indicative of the presence of moisture which renders said dielectric material less insulating.

44 Claims, 8 Drawing Sheets

(56) References Cited

U.S. PATENT DOCUMENTS

| | | | | |
|---|---|---|---|---|
| 10,964,611 B2* | 3/2021 | Munder | ............... | H01L 23/645 |
| 2014/0291677 A1* | 10/2014 | Le Neel | ............. | G01L 19/0092 |
| | | | | 257/48 |
| 2015/0348708 A1* | 12/2015 | Guo | ...................... | H01B 3/306 |
| | | | | 29/25.03 |

FOREIGN PATENT DOCUMENTS

| | | | |
|---|---|---|---|
| EP | 2718706 | A1 | 4/2014 |
| EP | 2720034 | A1 | 4/2014 |

\* cited by examiner

METHOD FOR DETECTING MOISTURE IN AN INTEGRATED CIRCUIT, AND ASSOCIATED INTEGRATED CIRCUIT

PRIORITY CLAIM

This application claims the priority benefit of French Application for Patent No. 1908238, filed on Jul. 19, 2019, the content of which is hereby incorporated by reference in its entirety to the maximum extent allowable by law.

TECHNICAL FIELD

Embodiments and implementations relate to integrated circuits and, in particular, to the detection of a risk of failure of integrated circuits impregnated with moisture.

BACKGROUND

During its lifetime, an integrated circuit is subjected to conditions of use of various natures which, in particular, are susceptible of allowing moisture to penetrate into an interconnect region (known to the person skilled in the art by the term BEOL, "Back End of Line") of the integrated circuit.

Moisture alters the dielectric material between the conductor tracks of the interconnect region, resulting in leakage currents passing through the dielectric material, causing stray electrical connections between the tracks in the interconnect region when the moisture level in the interconnect region exceeds a threshold allowing electrical conduction and/or coupling in the dielectric material.

The stray electrical connections are susceptible of bringing about a failure of the integrated circuit, leading to problems with reliability of the system incorporating the integrated circuit.

In automobile applications demanding a high level of reliability, for example an integrated circuit controlling an anti-lock system for the wheels of a vehicle ("ABS"), a failure of the integrated circuit could cause a loss of control of the vehicle.

It is necessary to prevent a failure of the integrated circuit caused by moisture.

In order to guarantee a high level of reliability for the integrated circuit, preventative methods are known in the prior art which are aimed at guarding against the effects of moisture. These methods, in particular, encompass establishing steps for monitoring and testing for moisture during fabrication of the integrated circuit, and a functional and structural definition of the integrated circuit in order to minimize the effect of moisture, in particular by encapsulation of the integrated circuit in a casing minimizing the penetration of moisture.

However, it is very difficult to predict the penetration of moisture into the integrated circuit during the lifetime of the integrated circuit, and so preventative methods are not always effective.

There is a need for a more effective guard against the effects of moisture in an integrated circuit.

There would be an advantage if, instead of applying preventative measures or as a supplement to these preventative measures, detection could be made of the presence of moisture in the integrated circuit once it has been fabricated and is operational, in particular when this moisture is susceptible of causing a failure of the integrated circuit.

SUMMARY

In accordance with the embodiments and implementations, the detection of the presence of moisture in the integrated circuit is made by measuring a current and comparing the measured current with one or more reference thresholds, in particular in order to prevent the failure of the integrated circuit if the measured current is higher than the reference threshold(s).

Furthermore, in accordance with the embodiments and implementations, heating at least a portion of the interconnect region of the electrical circuit is made if the measured current is higher than the reference threshold(s) in order to render the integrated circuit functional or to ward off its failure it is still functional.

In accordance with one aspect, a method comprises detecting moisture in an integrated circuit, where said detecting is carried out autonomously by the integrated circuit itself.

This detection is advantageously carried out on a completely fabricated or produced, operational or functional integrated circuit.

This detection may be carried out before, after or during the operational function of the integrated circuit.

In accordance with one embodiment, said detection comprises: application of at least one potential difference between at least one first track located in at least one metal level of an interconnect region of the integrated circuit and at least one second track located in said at least one metal level of said interconnect region and separated from the first track by a dielectric material, measurement of at least one current which is susceptible of circulating in one of the first and second tracks, said at least one possible current being generated from said at least one potential difference in the presence of moisture which renders said dielectric material less insulating, and comparison of said at least one measured current with at least one first threshold.

The progress of the moisture in an interconnect region of the integrated circuit may be detected by monitoring the derivative of a single parameter (leakage current or measured current), the detection being carried out autonomously by said circuit.

In accordance with one embodiment, the method comprises a comparison of said at least one measured current with a second threshold, the second threshold being higher than the first threshold.

In accordance with another embodiment, the method comprises issuing a first notification when the measured current is higher than said first threshold.

The integrated circuit thus provides a warning that it is probably defective or that it soon will be so.

In accordance with another embodiment, the method comprises issuing a second notification when the measured current is higher than the second threshold.

In accordance with one embodiment, the steps of application of the potential difference, of measurement of the current and of comparison are repeated at regular intervals as long as the current is lower than the first threshold.

The detection of moisture in the integrated circuit is therefore advantageously carried out in a regular manner over time.

In accordance with another embodiment, each metal level comprises a first track and a second track, the set of first tracks being connected together in series or in parallel and the set of second tracks being connected together in series or in parallel, and the method comprises the application of the potential difference between the set of first tracks and the set of second tracks, and the measurement of the current possibly circulating in the set of first or second tracks.

The detection of moisture is therefore advantageously carried out over the entire height of the interconnect region.

In accordance with another embodiment, each metal level comprises a first track and a second track, said first tracks not being connected together and said second tracks not being connected together, and the method comprises the application of the potential difference between each first track and each second track, and the measurement of the current possibly circulating in each of the first or second tracks.

The detection can therefore advantageously be used to identify the metal level in which the moisture is located.

In accordance with another embodiment, each metal level comprises a first track and a second track, said first tracks not being connected together and said second tracks being connected together in series or in parallel, the method comprising the application of the potential difference between each first track and the set of second tracks, and the measurement of the current possibly circulating in each of the first tracks.

In accordance with one embodiment, the method comprises a simultaneous application of the potential difference between the set of first and of second tracks. It is possible to carry out a continuous application of the potential difference between at least one first track and at least one second track.

In a variation, it is possible to carry out an application of the potential difference between at least one first track and at least one second track at regular time intervals during a first period.

The energy consumption of the integrated circuit is reduced thereby.

It is possible, for example, to provide the first and second tracks on the periphery of the integrated circuit.

The entirety of the interconnect region of the integrated circuit is monitored thereby. In accordance with one embodiment, when the current measured in at least one first or one second track is higher than the first threshold, the method comprises an injection of an additional current into at least one third track located in the interconnect region and above or below the first and second tracks, in a manner such as to heat at least a portion of the integrated circuit in order to evaporate the moisture.

In accordance with one embodiment, when the current measured in at least one first or one second track is higher than the first threshold, the method comprises an injection of an additional current into at least one third track located in the interconnect region and located in the same metal level as the first and second tracks in a manner such as to heat at least a portion of the integrated circuit in order to evaporate the moisture.

The injection of the additional current into the third track may be carried out during a second period.

In accordance with another embodiment, when the current measured in at least one first or one second track is higher than the first threshold, the method comprises an injection, during a third period, of a supplemental current into the first and/or second tracks in a manner such as to heat at least a portion of the integrated circuit in order to evaporate the moisture.

In accordance with yet another possible embodiment, when the current measured in at least one first or one second track is higher than the first threshold, the method comprises an activation, during a fourth period, of a heating device which is thermally coupled to said interconnect portion in a manner such as to heat a portion of the integrated circuit in order to evaporate the moisture.

The method may comprise a repetition of the application of the potential difference, of the measurement of the current, of the comparison and of the injection of a current or of the activation of the heating device as long as the measured current is higher than the first threshold or as long as the measured current is higher than the first threshold and as long as the number of repetitions is fewer than a predetermined number of attempts.

In accordance with another aspect, an integrated circuit is proposed, incorporating a detection circuit which is configured to detect moisture possibly in the integrated circuit in an autonomous manner.

In accordance with one embodiment, the integrated circuit comprises an interconnect region comprising, in at least one metal level, at least one first track and at least one second track separated by a dielectric material, and the detection circuit comprises: a potential applying circuit configured to apply at least one potential difference between said at least one first track and said at least one second track, a current measuring circuit configured to measure at least one current which is susceptible of circulating in said at least first or second track, said at least one possible current being generated from said at least one potential difference in the presence of moisture which renders said dielectric material less insulating, and a comparing circuit which is connected to the current measuring circuit and which is configured to compare said at least one measured current with at least one first threshold.

In accordance with one embodiment, the detection circuit additionally comprises a communication circuit configured to issue a notification when the measured current is higher than said first threshold.

In accordance with one embodiment, the communication circuit is additionally configured to issue a notification when the measured current is higher than said second threshold.

In accordance with one embodiment, each metal level of the interconnect region comprises a first track and a second track, the set of first tracks being connected together in series or in parallel and the set of second tracks being connected together in series or in parallel, the potential applying circuit is configured to apply the potential difference between the set of first and of second tracks, and the current measuring circuit is configured to carry out the measurement of the current possibly circulating in the set of first or second tracks.

In accordance with one embodiment, each metal level comprises a first track and a second track, one of the first and second tracks being connected to the current measuring circuit, said first tracks not being connected together and said second tracks not being connected together, the potential applying circuit configured to apply the potential difference between each first track and each second track, and the current measuring circuit is configured to carry out the measurement of the current possibly circulating in each first or second track.

In accordance with one embodiment, each metal level comprises a first track connected to the current measuring circuit and a second track, said first tracks not being connected together and said second tracks being connected together in parallel or in series, the potential applying circuit is configured to apply the potential difference between each first track and the set of second tracks, and the current measuring circuit is configured to carry out the measurement of the current possibly circulating in each first track.

In accordance with one embodiment, the potential applying circuit is configured to apply the potential difference continuously between at least one first track and at least one second track.

In accordance with one embodiment, the potential applying circuit is configured to apply the potential difference at regular time intervals during a first period between at least one first track and at least one second track.

In accordance with one embodiment, the first and second tracks are disposed on the periphery of the integrated circuit.

In accordance with one embodiment, the integrated circuit additionally comprises a heating circuit configured to heat at least a portion of the integrated circuit in order to evaporate the moisture when the current measured in at least one first track or at least one second track is higher than said first threshold.

The heating circuit is advantageously configured to displace the moisture inside the integrated circuit in a manner such that the moisture does not cause failure of the circuit.

In accordance with one embodiment, the heating circuit comprises a current injecting circuit and at least one third track located in the interconnect region and above or below the first and second tracks, the current injecting circuit configured to inject an additional current into the third track in a manner such as to heat up the third track by the Joule effect.

In accordance with one embodiment, the heating circuit comprises a current injecting circuit and at least one third track located in the interconnect region and located in the same metal level as the first and second tracks, the current injecting circuit configured to inject an additional current into the third track in a manner such as to heat up the third track by the Joule effect.

The dimensions of these third tracks, or heating tracks, inserted into the interconnect region are advantageously such as to ensure optimized heating.

In accordance with one embodiment, the current injecting circuit is configured to inject the additional current during a second period.

In accordance with one embodiment, the heating circuit comprises a current injecting circuit configured so that, when the current measured in at least one first or one second track is higher than said first threshold, the first and second tracks are heated up by the Joule effect during a third period.

Since the first and second tracks here are used in order to heat the interconnect region, the bulk of the heating circuit in the interconnect region is reduced.

In accordance with one embodiment, the heating circuit comprises a heating device which is thermally coupled to the interconnect portion of the integrated circuit and a control circuit configured to control the heating device.

In accordance with one embodiment, the comparison circuit comprises a non-volatile memory containing a reference value for said at least one first threshold.

In accordance with another aspect, an appliance is proposed which incorporates an integrated circuit as hereinbefore defined.

BRIEF DESCRIPTION OF THE DRAWINGS

Other advantages and characteristics will become apparent from an examination of the detailed description of embodiments, which are not in any way limiting, and of the accompanying drawings in which.

DETAILED DESCRIPTION

Figure 1:
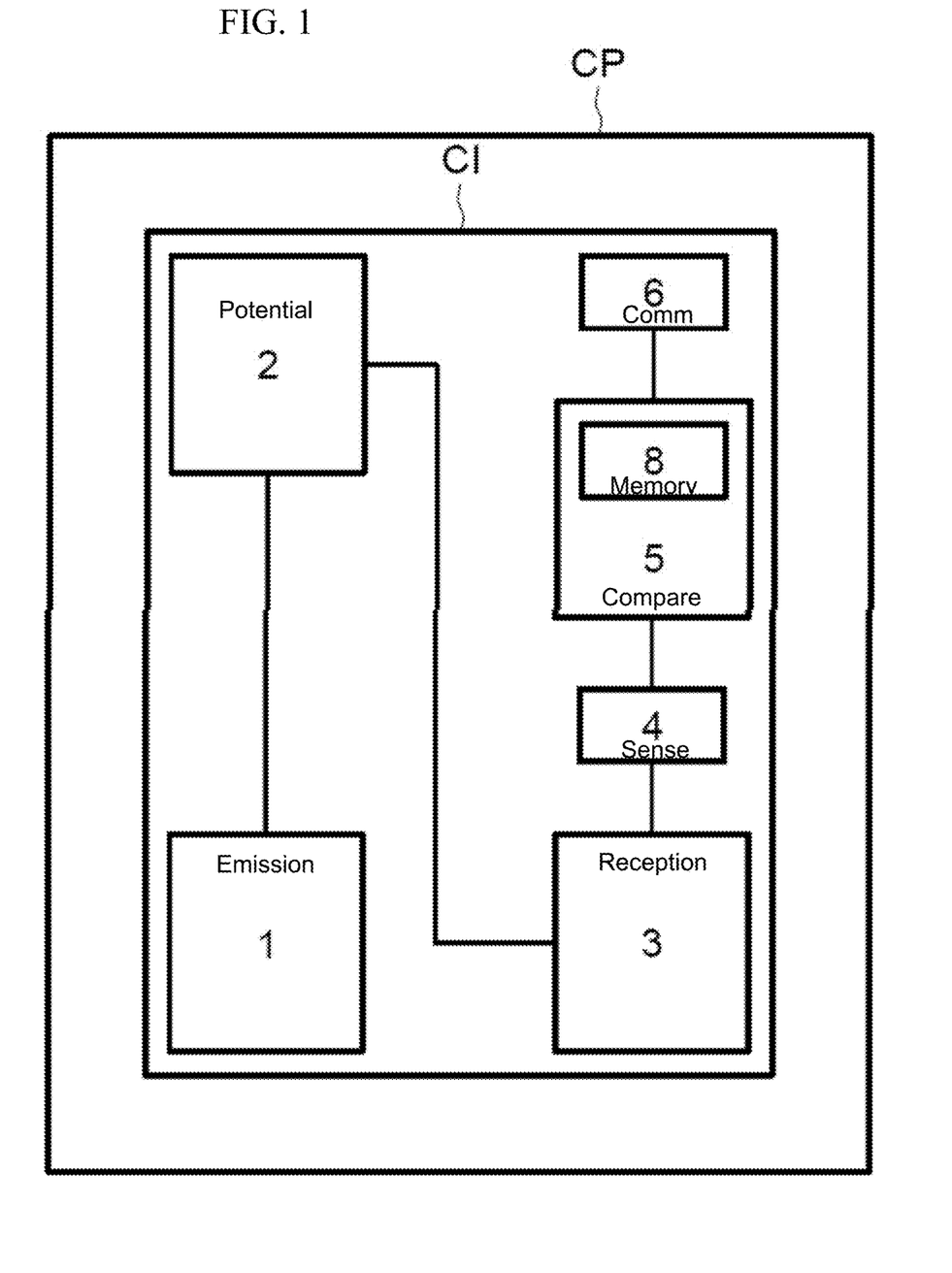
FIGS. 1 and 2 show an example of a first embodiment of an integrated circuit.
Figure 2:
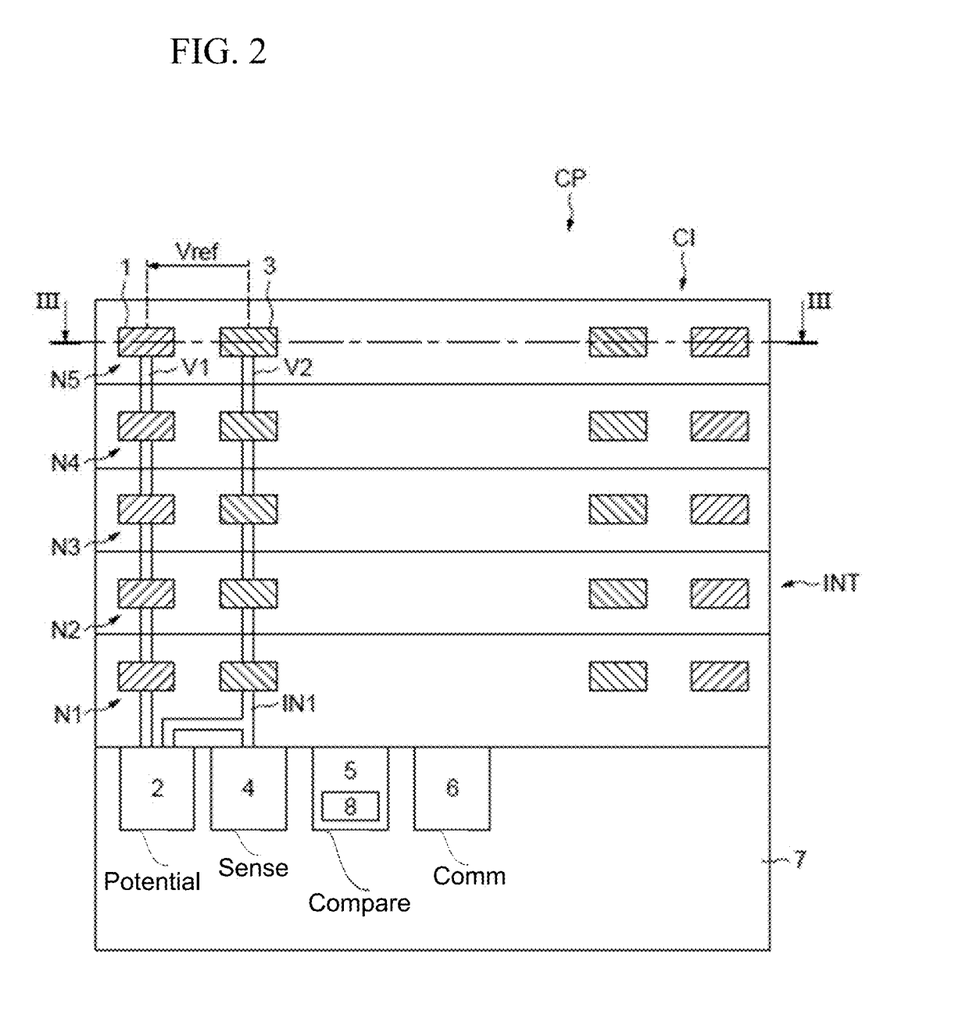
Figures 3, 4:
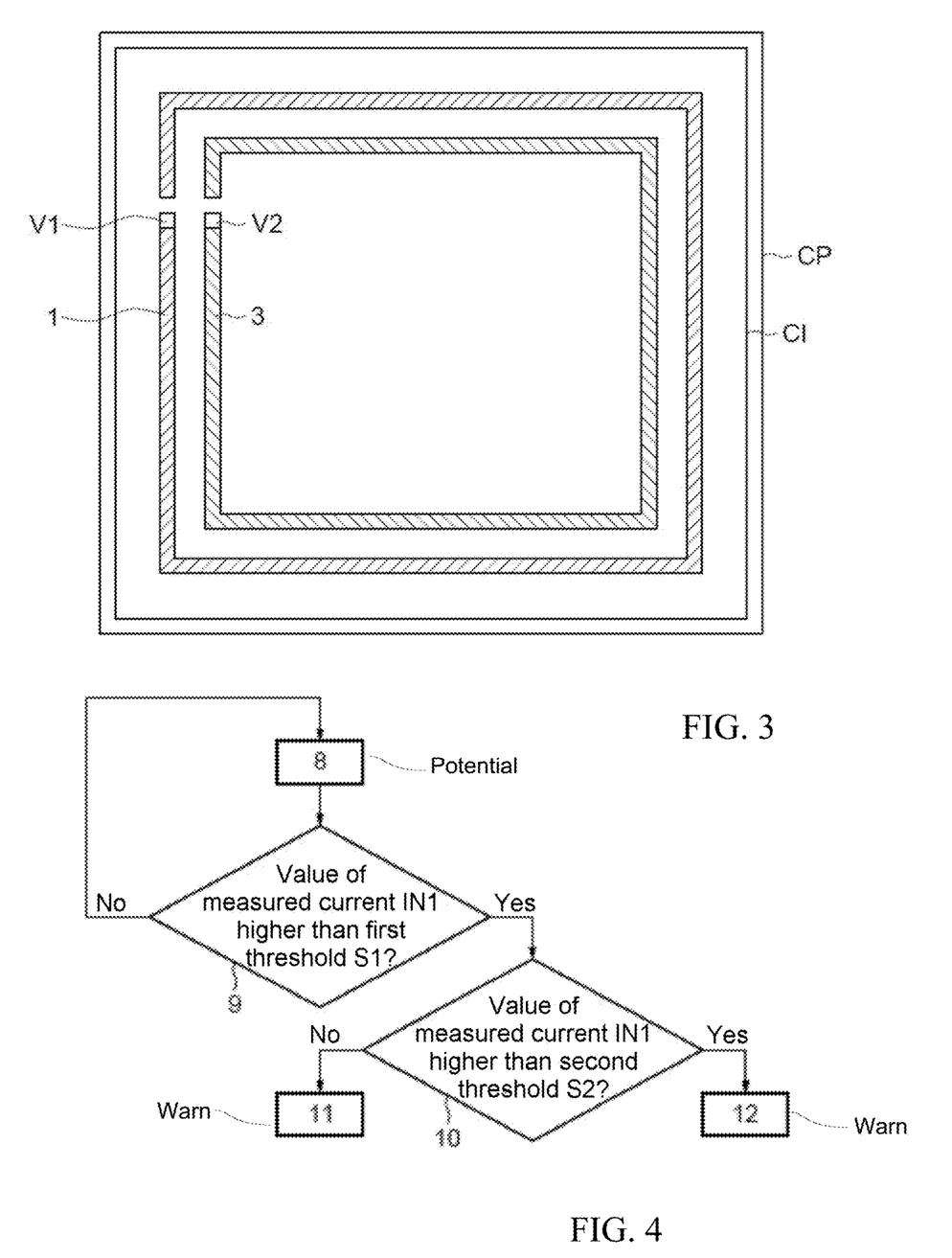
FIG. 3 illustrates a partial sectional view along the sectional line of FIG. 2.
FIG. 4 illustrates an example of an implementation of the first embodiment of the integrated circuit.

Reference is made to FIGS. 1 and 2, which represent an example of a first embodiment of an integrated circuit C1, and to FIG. 3, which illustrates a partial sectional view along the sectional line of FIG. 2, the integrated circuit C1 being incorporated into an electronic appliance CP, for example a control device for an anti-lock system for the wheels of an automotive vehicle.

The integrated circuit C1 incorporates a detection circuit configured to autonomously detect moisture that might possibly be in the integrated circuit.

More precisely, and in accordance with one embodiment, the integrated circuit here (FIG. 2) comprises at least one first track (emission track) 1, and at least one second track (reception track) 3, separated from said at least one first track 1 by an electrically insulating (or dielectric) material.

Furthermore, the detection circuit comprises: potential applying circuit 2 which is connected to the emission track 1 and to the reception track 3, and configured to apply a potential difference Vref between the tracks 1 and 3, current measuring circuit 4 which is connected to said at least one reception track 3 and configured to measure a current IN1, or leakage current, which is susceptible of circulating in said at least one reception track 3, this possible current being generated from said at least one potential difference in the presence of moisture which renders said dielectric material less insulating, and a comparison circuit 5 which is connected to the current measuring circuit 4 and configured to compare the measured current in said at least one reception track 3 with a first threshold S1.

In a variation, the emission track 1 may be connected to the current measuring circuit 4 in a manner such as to measure a possible leakage current generated from the potential difference.

The comparison circuit 5 may be configured to compare the measured current IN1 with a second threshold S2 which is higher than the first threshold S1.

Clearly, the comparison circuit 5 may be configured to compare the current IN1 with more than two thresholds.

The emission tracks 1 and reception tracks 3 are located in an interconnect region INT (known to the person skilled in the art by the acronym BEOL: "Back End Of Line"), and are, for example, disposed on the periphery of the integrated circuit C1.

The entirety of the integrated circuit C1 is advantageously monitored thereby.

In a variation, the tracks 1 and 3 may be disposed on a portion of the periphery of the circuit C1 or on any other region of the circuit C1.

The detection circuit may additionally comprise a communication circuit 6 connected to the comparison circuit 5 and configured to issue a notification when the measured current IN1 is, for example, higher than a first threshold S1, for example by illuminating an indicator light (not shown).

If the measured current IN1 is higher than the second threshold S2, the communication circuit 6 is, for example, configured to issue a text message on a screen.

As illustrated in FIG. 2, the integrated circuit C1 comprises a semiconductor substrate 7, into which the potential applying circuit 2, the current measuring circuit 4, the comparison circuit 5 and the communication circuit 6 are integrated.

The potential applying circuit 2 comprises, for example, a source of voltage potential Vref connected to the emission track 1 and a ground terminal connected to the reception track 3, and the comparison circuit 5 comprises, for example, a non-volatile memory 8 containing the threshold value S1 and the threshold value S2.

The threshold S1 is, for example, determined by measuring, for a given potential difference Vref applied between the emission track 1 and reception track 3, the current IN1 in the reception track 3 measured by the current measuring circuit 4 when the integrated circuit C1 leaves the production line, i.e. when it does not contain moisture.

In a variation, the threshold S1 may be determined by measurements carried out in a laboratory.

In accordance with yet another variation, the threshold S1 is equal to a measurement carried out by the current measuring circuit 4.

The potential difference Vref is determined in a manner such as to obtain an electric field generating a current IN1 which is measurable by the compact current measuring circuit 4. The potential difference Vref is, for example, in the range 0.1 Volts and 10 Volts in a manner such as to generate a field of the order of MVolt/cm.

For automotive products using 90 nm technology, the first threshold S1 is, for example, equal to 10 to 100 times the value measured for the current IN1 when the circuit C1 leaves the production line.

The second threshold S2 is, for example, equal to 10 times the first threshold S1, such that if the measured current IN1 reaches the second threshold S2, the integrated circuit C1 is, for example, considered to be defective.

The substrate 7 is surmounted by the interconnect region INT which here comprises a plurality of metal levels N1, N2, N3, N4 and N5 each comprising an emission track 1 and a reception track 3 encased in the dielectric material (known to the person skilled in the art by the term "intermetal dielectric").

Each reception track 3 is thus located in the same plane as the emission track 1, said plane being parallel to the metal levels.

The emission tracks 1 of the set of metal levels N1, N2, N3, N4 and N5 are connected together in series by means of vias V1 and the set of reception tracks of the set of metal levels N1, N2, N3, N4 and N5 are connected together in series by the vias V2.

The tracks which are mutually connected in series are connected together via a single connection.

In a variation, the emission tracks 1 of the set of metal levels are connected in parallel, i.e., said tracks are connected together by means of at least two connections. Clearly, the reception tracks 3 of the set of metal levels may also be connected in parallel.

Since each metal level N1 to N5 comprises an emission track 1 and a reception track 3, the detection of moisture is carried out over the entire height of the interconnect region INT.

In a variation, the integrated circuit C1 may comprise a single emission track 1 and a single reception track 3 in a selected metal level, preferably in the upper metal level, or N5 in this example, which is more sensitive to moisture.

Reference will now be made to FIG. 4, which illustrates an example of an implementation of the first embodiment of the integrated circuit C1.

It is assumed that the metal level N5 contains a moisture level which is higher than a moisture level corresponding to the threshold S1.

In a step 8, the potential applying circuit 2 applies the potential difference Vref between the emission tracks 1 and the reception tracks 3.

The potential applying circuit 2 may apply the potential difference Vref continuously or at regular time intervals during a first period T1.

Applying the potential difference Vref intermittently can reduce the energy consumption of the circuit C1 compared with applying the tension Vref continuously.

The current measuring circuit 4 measures the current IN1 circulating in the reception tracks 3 and the comparison circuit compare the current IN1 with the first threshold S1 (step 9).

If the value for the current IN1 is less than or equal to the first threshold S1, step 8 is repeated, the repetition possibly taking place immediately or after a predetermined repetition period, for example of twenty-four hours.

In the case in which the level N5 contains moisture, the dielectric material encasing the tracks 1 and 3 has a conductivity which is higher than that of the dielectric material containing no moisture, and the value for the current IN1 is higher than the first threshold S1.

The current measuring circuit 4 measures the current IN1 circulating in the reception tracks 3 and the comparison circuit compare the current IN1 with the second threshold S2 (step 10).

If the current IN1 is not higher than the second threshold S2, then step 11 is carried out.

In step 11, the communication circuit 6 advises of the presence of moisture in the integrated circuit C1, warning of the probable failure of the circuit C1.

As an example, this first notification warns the user of a vehicle incorporating the circuit C1 in an anti-lock system for wheels that the anti-lock system for wheels will soon no longer be functional and urges that repairs to the vehicle be carried out.

If the current IN1 is higher than a second threshold S2, then step 12 is carried out.

In step 12, the communication circuit 6 advises of the presence of moisture in the integrated circuit C1, warning of the definite failure of the circuit C1.

As an example, this second notification warns the user of the vehicle that the anti-lock system for wheels is no longer functional.

Figure 5:
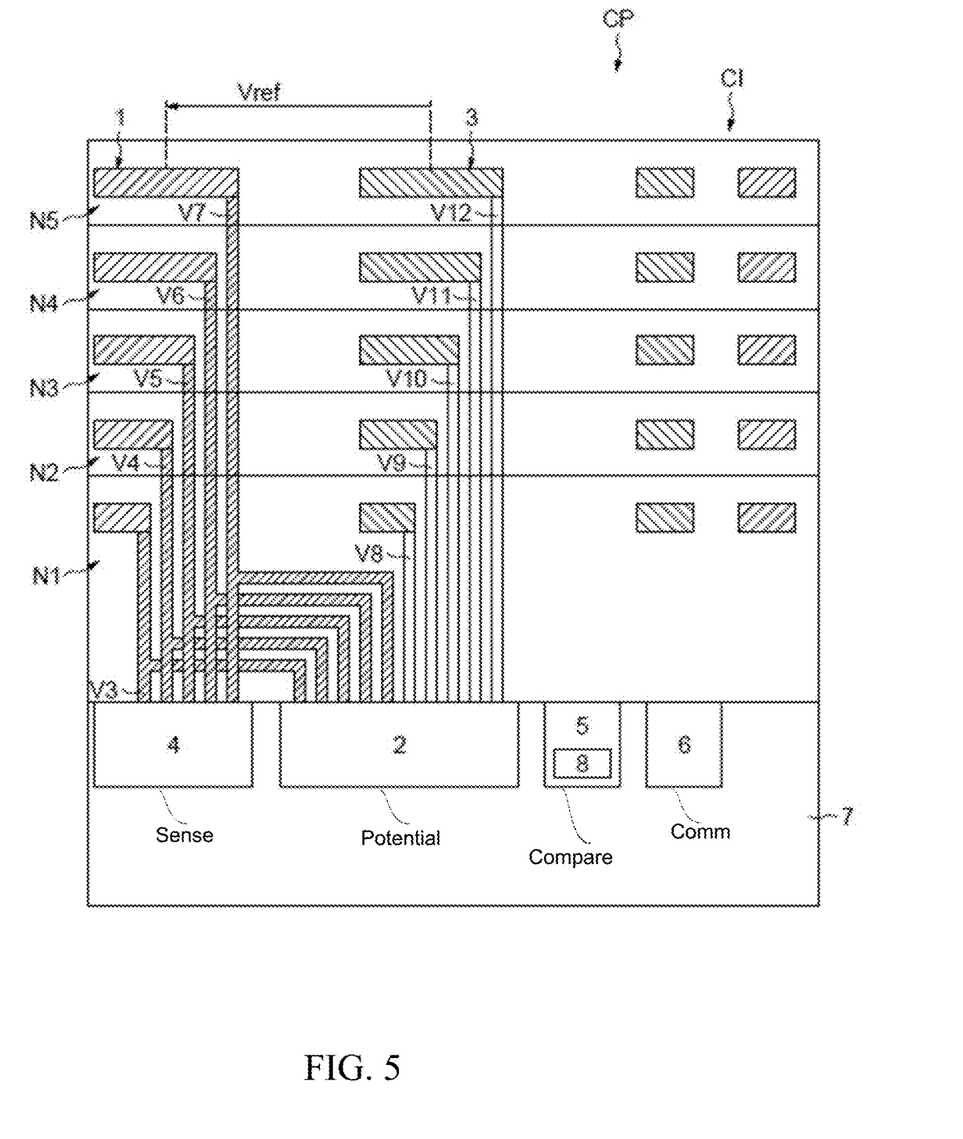
FIG. 5 illustrates a second embodiment of the integrated circuit

FIG. 5 illustrates a second embodiment of the integrated circuit C1.

Again, the metal levels N1 to N5 can be seen, each comprising an emission track 1 and a reception track 3, and the potential applying circuit 2, the current measuring circuit 4, the comparison circuit 5 and the communication circuit 6 integrated into the substrate 7.

This embodiment of the circuit C1 differs from the first embodiment illustrated in FIGS. 1 to 3 in that each emission track 1 of each metal level N1 to N5 is connected to potential applying circuit 2 and to the current measuring circuit 4 by independent vias V3 to V7, and each reception track 3 of each metal level N1 to N5 is connected to the potential applying circuit 2 by independent vias V8 to V12, the various emission tracks not being connected together and the various reception tracks not being connected together.

The leakage current in each metal level N1 to N5 is measured and compared with the thresholds S1 and S2 independently of the other metal levels, meaning that the metal level in which a concentration of moisture is higher than the reference moisture level(s) can be identified.

The thresholds S1 and S2 with different values may be associated with each metal level N1 to N5 in order to take into account the different characteristic geometries of the tracks 1 and 3 in each metal level N1 to N5, for example the thickness of the tracks, the length of the tracks, the width of the vias V3 to V12.

The determination of the "defective" metal level means that, for example, the step(s) of the method for the fabrication of the integrated circuit which has/have given rise to at least one anomaly can be determined more easily.

Figure 6:
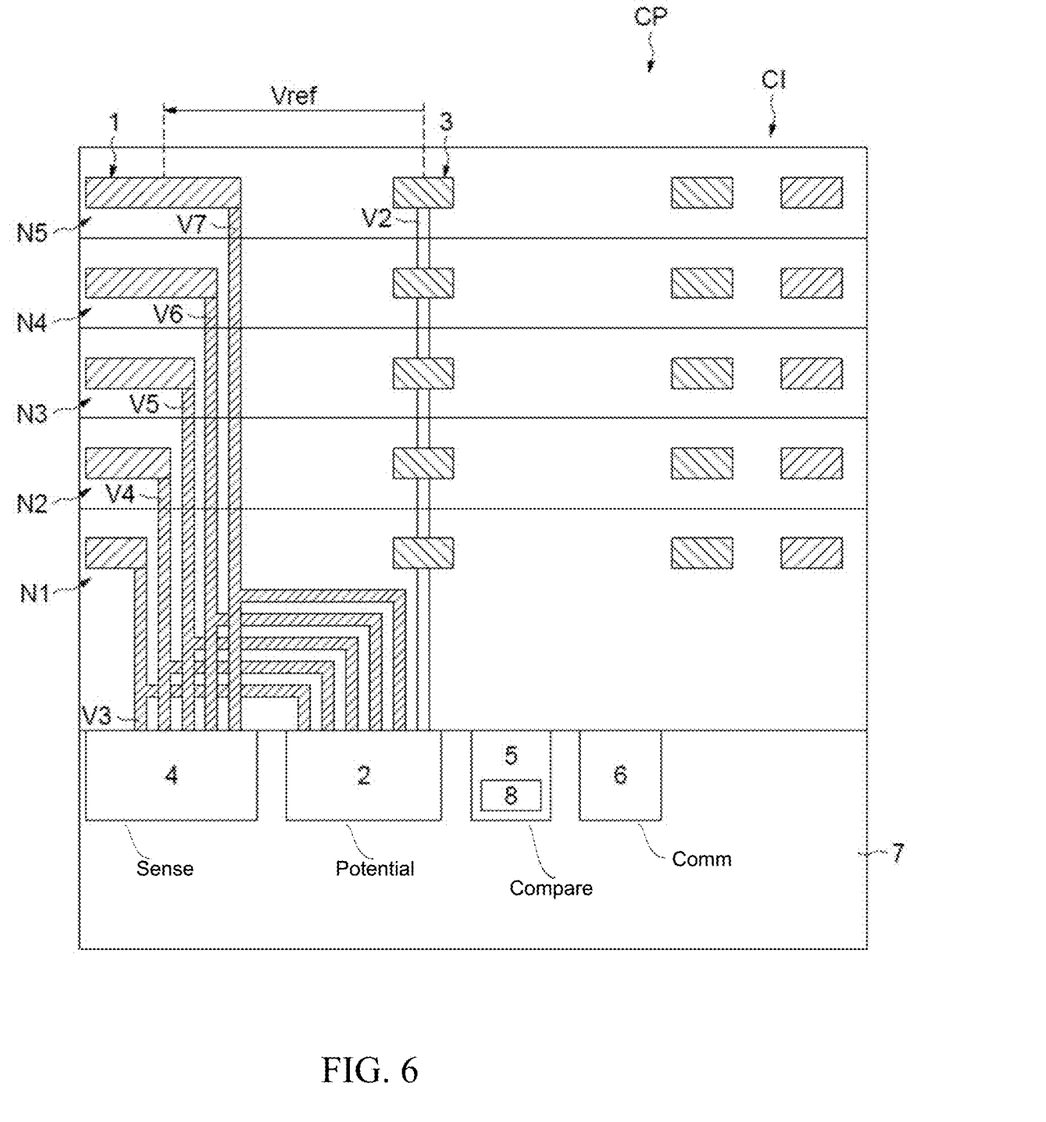
FIG. 6 illustrates a third embodiment of the integrated circuit.

FIG. 6 illustrates a third embodiment of the integrated circuit C1.

Again, the metal levels N1 to N5 can be seen, each comprising an emission track 1 and a reception track 3, and the potential applying circuit 2, the current measuring circuit 4, the comparison circuit 5 and the communication circuit 6 integrated into the substrate 7.

This embodiment of the circuit C1 differs from the first embodiment illustrated in FIGS. 1 to 3 in that each emission track 1 of each metal level N1 to N5 is connected to the potential applying circuit 2 and to the current measuring circuit 4 by the independent vias V3 to V7.

The leakage current circulating in each emission track 1 in each metal level N1 to N5 is measured and compared with the thresholds S1 and S2 independently of the other metal levels, meaning that the metal level in which a concentration of moisture is higher than the reference moisture level(s) can be identified.

The thresholds S1 and S2 with different values may be associated with each metal level N1 to N5 in order to take into account the different characteristic geometries of the tracks 1 and 3 in each metal level N1 to N5, for example the thickness of the tracks, the length of the tracks, the length of the vias V3 to V12.

The determination of the "defective" metal level means that, for example, the step(s) of the method for the fabrication of the integrated circuit which has/have given rise to at least one anomaly can be determined more easily, while at the same time being more compact than in the case of the second embodiment of the circuit C1 illustrated in FIG. 5.

Furthermore, since the reception tracks 3 are connected in series or in parallel, the connection of the tracks 3 to the potential applying circuit 2 is simpler to carry out than in the second embodiment of the integrated circuit C1.

In a variation, the emission tracks 1 are connected together in series or in parallel and each reception track 3 is connected to the potential applying circuit 2 and to the current measuring circuit 4 by the independent vias, the leakage current circulating in each reception track being measured.

The embodiments of the integrated circuit C1 described above can be used to detect moisture in the circuit C1 which is susceptible of causing it to fail.

The embodiments of the integrated circuit C1 described below additionally comprise a heating circuit configured to heat at least a portion of the integrated circuit C1 in order to evaporate the moisture when the current measured in at least one reception track 3 is higher than the first threshold S1.

The heating circuit is configured to heat the entirety of the integrated circuit C1. The heating circuit is configured, for example, to redistribute the moisture present in the interior of the integrated circuit C1 in a manner such that the moisture does not cause the failure of the integrated circuit C1.

Figure 7:
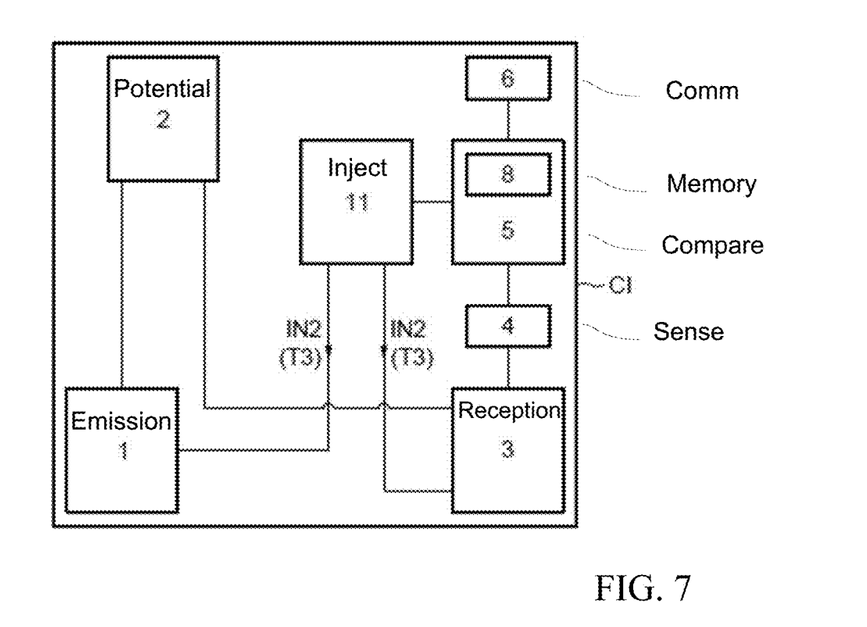
FIG. 7 illustrates a fourth embodiment of the integrated circuit comprising a first embodiment of the heating circuit.

FIG. 7 illustrates a fourth embodiment of the integrated circuit C1 comprising a first embodiment of the heating circuit.

The emission track 1, the reception track 3, the potential applying circuit 2, the current measuring circuit 4, the comparison circuit 5 and the communication circuit 6 can again be seen.

The integrated circuit additionally comprises the heating circuit comprising a supplemental current injecting circuit 11, for example a current source.

The supplemental current injecting circuit 11 is connected to tracks 1 and 3, and to the comparison circuit 5.

This embodiment of the heating circuit is implemented in the circuit C1 only if the section of the tracks 1 and 3 is sufficient for the current IN2 delivered by the current injecting circuit 11 to be sufficient to heat up the reception tracks and emission tracks by the Joule effect during a period T3.

Since the tracks 1 and 3 are used to heat the interconnect region INT, the bulk of the heating circuit in the interconnect region is reduced.

The period T3 is determined, for example, as a function of the section of the tracks 1 and 3, and of the value for the current delivered by the current injecting circuit 11 in a manner such that the thermal energy released by the tracks 1 and 3 during the period T3 is sufficient to render the circuit C1 functional once again.

The current injecting circuit 11 delivers the current IN2 during the period T3 when the comparison circuit 5 has determined that the current IN1 is higher than the threshold S1.

Figure 8:
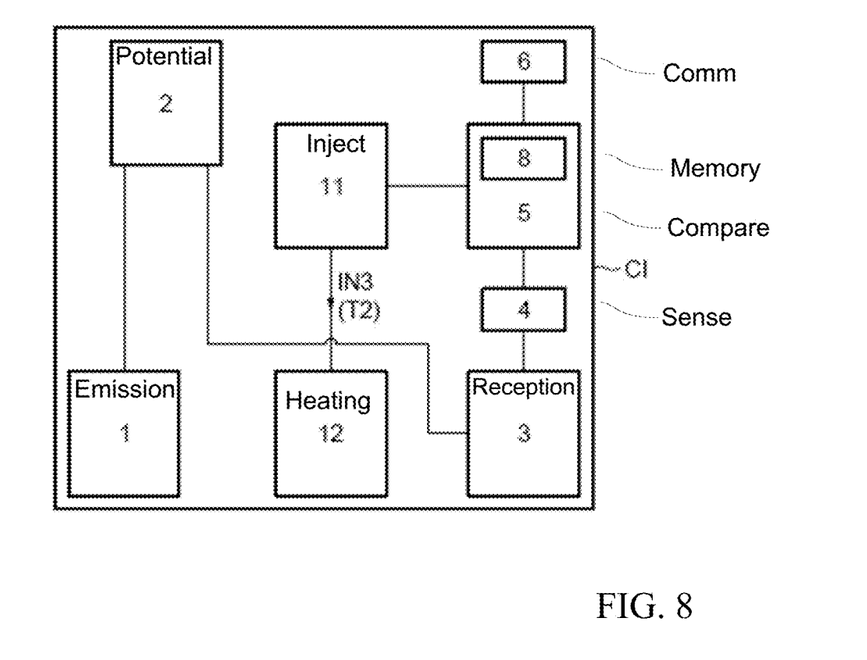
FIGS. 8 and 9 illustrate a fifth embodiment of the integrated circuit comprising a second embodiment of the heating circuit.
Figure 9:
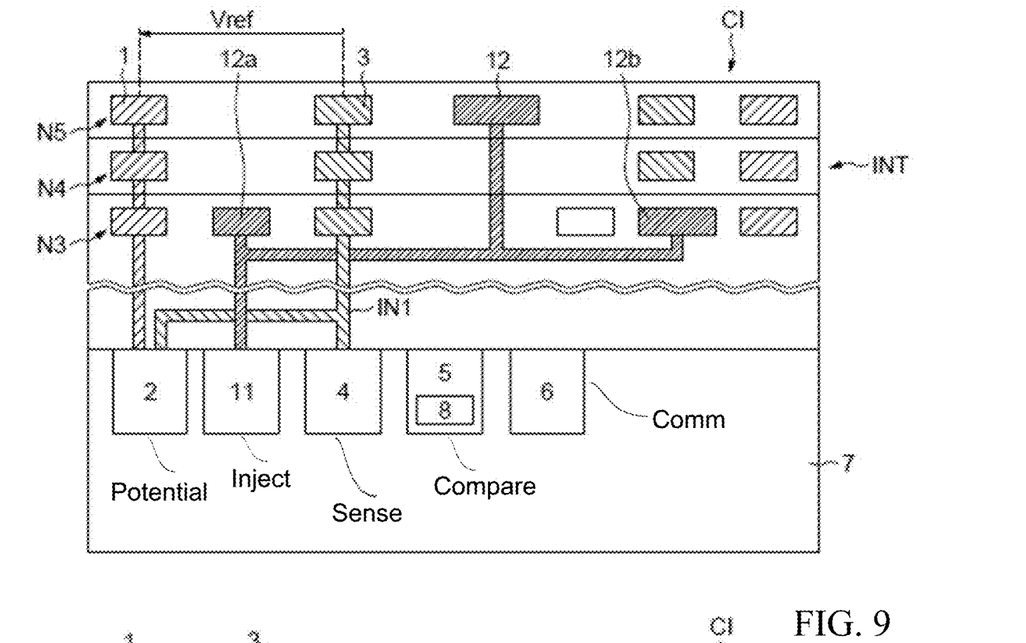

FIGS. 8 and 9 illustrate a fifth embodiment of the integrated circuit C1 comprising a second embodiment of the heating circuit, FIG. 9 being a partial view representing the metal levels N3 to N5 and the substrate 7.

Once again, the emission track 1, the reception track 3, the potential applying circuit 2, the current measuring circuit 4, the comparison circuit 5, the communication circuit 6 and the current injecting circuit 11 can be seen.

This embodiment of the circuit C1 differs from the third embodiment of the circuit C1 illustrated in FIG. 6 in that the circuit C1 additionally comprises third tracks, or heating tracks, 12 located in the interconnect region INT and located above and/or below and/or in the same metal level as the emission tracks 1 and reception tracks 3, the heating tracks 12 being connected to the current injecting circuit 11 which are configured to heat up the heating tracks 12 by the Joule effect when the current measured in at least one first or at least one second track is higher than said threshold S1.

The dimensions of the heating tracks 12 added to the interconnect region INT are such as to ensure optimized heating.

The heating circuit here comprises the current injecting circuit 11 and the heating tracks 12.

The current injecting circuit 11 supplies the heating tracks 12 with current for a period T2 determined as a function of the section of the heating tracks 12 and of the value for the current IN3 delivered by the current injecting circuit 11 in a manner such that the thermal energy released by the heating tracks 12 during the period T2 is sufficient to render the circuit C1 functional once again.

Figure 10:
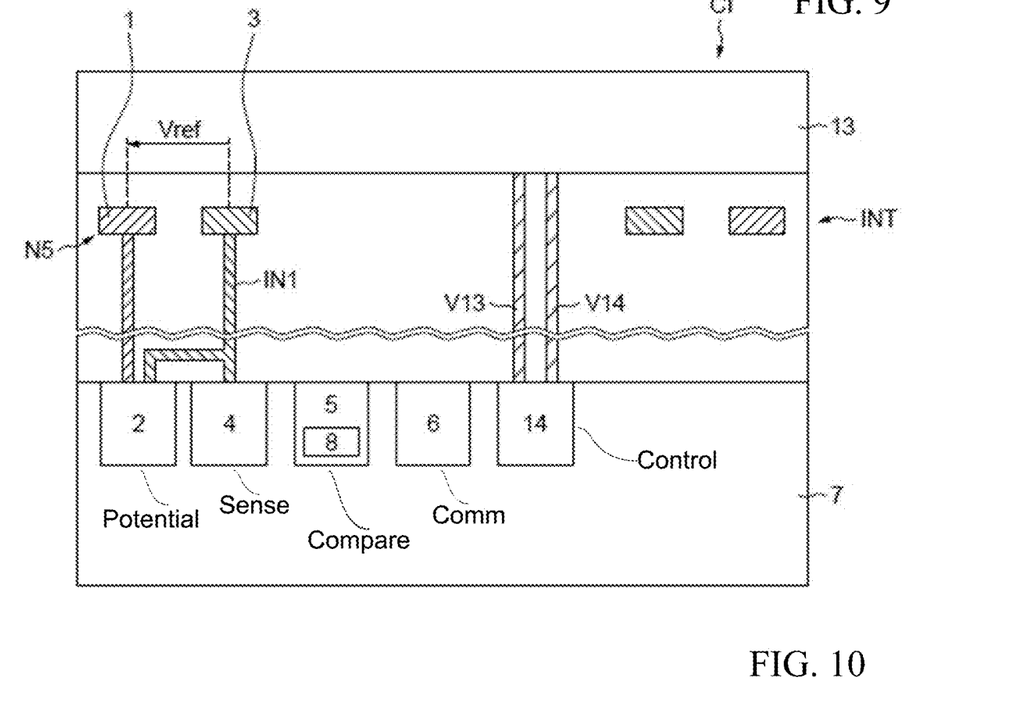
FIG. 10 which illustrates a sixth embodiment of the integrated circuit comprising a third embodiment of the heating circuit.

Reference will now be made to FIG. 10, which illustrates a partial view of the metal level N5 and of the substrate 7 of a sixth embodiment of the integrated circuit C1 comprising a third embodiment of the heating circuit.

The heating circuit comprises a heating device 13 and control circuit 14 for the heating device.

The heating device 13 is thermally coupled to the interconnect portion INT, and in this regard, for example, is disposed above the upper face of the interconnect portion of the integrated circuit C1, for example above the metal level N5, and comprises a heating resistance, for example.

This heating resistance is electrically insulated from the interconnect portion INT.

The heating device disposed on the exterior of the interconnect portion means that the dimensions of the integrated circuit C1, in particular the interconnect region INT, can be optimized.

The control circuit 14 is located, for example, in the substrate 7 and is connected to the heating device 13 by means of vias V13 and V14 passing through the interconnect region INT, and are configured to control the heating device 13 in a manner such that it heats the circuit C1 for a period T4.

The period T4 is selected in a manner such that at the end of the heating period T4, the circuit C1 is functional.

Figure 11:
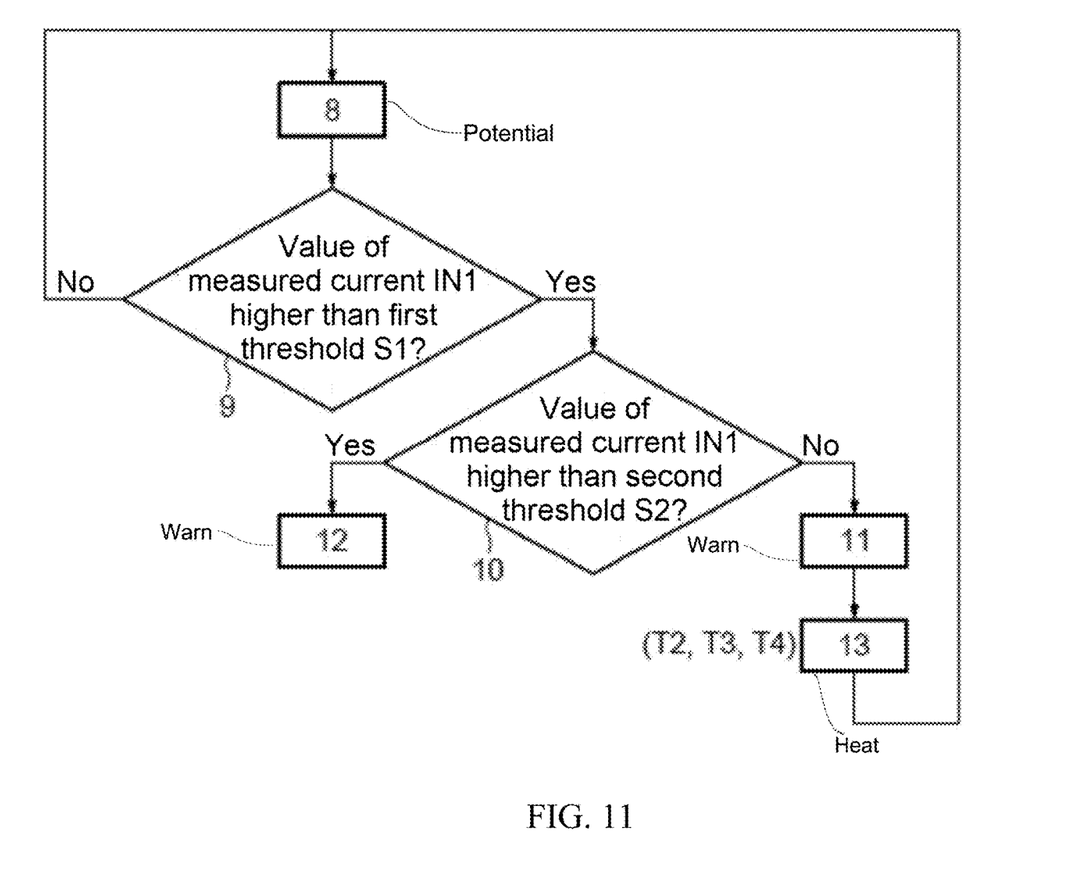
FIG. 11 illustrates an example of the implementation of the heating circuit.

FIG. 11 illustrates an example of the implementation of the heating circuit described above.

It is assumed that the metal level N5 contains moisture, so that the measured current IN1 is higher than the first threshold S1 and lower than the threshold S2.

The steps 8, 9, 10, 11 and 12 are seen again.

Step 11 is carried out, followed by step 13.

In step 13, if the integrated circuit C1 comprises the heating circuit in accordance with the first embodiment described in FIG. 7, the current injecting circuit 11 supplies the tracks 1 and 3 with current IN2 for the period T3.

If the integrated circuit C1 comprises the heating circuit in accordance with the second embodiment described in FIGS. 8 and 9, the current injecting circuit 11 supplies the heating tracks 12 with current IN3 for the period T2.

If the integrated circuit C1 comprises the heating circuit in accordance with the third embodiment described in FIG. 10, the control circuit 14 controls the heating device 13 in a manner such that it heats the circuit C1 for the period T4.

Next, at the end of one of the periods T2, T3 or T4, step 8 is repeated, the repetition possibly taking place immediately or after a predetermined repetition period of twenty-four hours, for example.

In a variation, the application of the potential difference, the measurement of the current, the comparison and the injection of a current or the activation of the heating device are repeated as long as the measured current is higher than the first threshold and as long as the number of repetitions is fewer than a predetermined number of attempts.

The embodiments of the integrated circuit C1 described above can be used to enable the integrated circuit C1 to detect the progress of moisture in the interconnect region INT by monitoring the derivative of a single parameter (leakage current or measured current) in an autonomous manner, and of warning of its probable failure.

If the integrated circuit comprises heating circuit, the integrated circuit C1 can repel the moisture in a manner such as to re-establish all of its functions, thereby prolonging the service life of the integrated circuit C1.

The production of the integrated circuit C1 as defined hereinabove does not necessitate the production of a supplemental mask.

The invention claimed is:

1. A method for detecting presence of moisture in an interconnect region of an integrated circuit, wherein said detecting is carried out autonomously by the integrated circuit itself and comprises:
    applying a potential difference between at least one first track located in at least one metal level of said interconnect region and at least one second track located in said at least one metal level of said interconnect region, wherein the at least one first track is separated from the at least one second track by a dielectric material;
    measuring at least one current circulating in said at least one first track or said at least one second track in response to said applied potential difference; and
    comparing said measured at least one current with at least one first threshold, wherein a result of said comparing is indicative of the presence of moisture which renders said dielectric material less insulating.

2. The method according to claim 1, further comprising comparing said measured at least one current with a second threshold, wherein the second threshold is higher than the first threshold.

3. The method according to claim 2, comprising:
    issuing a first notification when the measured at least one current is higher than said first threshold; and
    issuing a second notification when the measured at least one current is higher than the second threshold.

4. The method according to claim 1, wherein applying the potential difference, measuring the at least one current and comparing are repeated at regular intervals as long as the measured at least one current is lower than said first threshold.

5. The method according to claim 1, wherein each metal level comprises a first track and a second track, wherein a plurality of said first tracks are connected together in series or in parallel and a plurality of said second tracks are connected together in series or in parallel, and wherein applying comprises: applying the potential difference between the plurality of said first tracks and the plurality of said second tracks, and wherein measuring comprises measuring current circulating in one of the plurality of said first tracks or the plurality of said second tracks.

6. The method according to claim 1, wherein each metal level comprises a first track and a second track, wherein said first tracks are not connected together and said second tracks are not connected together, wherein applying comprises applying the potential difference between each first track and each second track, and wherein measuring comprises measuring the current circulating in each first track or each second track.

7. The method according to claim 6, wherein applying comprises simultaneously applying the potential difference between the first and second tracks.

8. The method according to claim 1, wherein each metal level comprises a first track and a second track, where said first tracks are not connected together and wherein a plurality of said second tracks are connected together in series or in parallel, wherein applying comprises applying the potential difference between each first track and the plurality of said second tracks, and wherein measuring comprises measuring the current circulating in each of the first tracks.

9. The method according to claim 8, wherein applying comprises simultaneously applying the potential difference between the first tracks and the plurality of second tracks.

10. The method according to claim 1, wherein applying comprises continuously applying the potential difference between at least one first track and at least one second track.

11. The method according to claim 1, wherein applying comprises applying the potential difference between at least one first track and at least one second track at regular time intervals during a time period.

12. The method according to claim 1, wherein the first and second tracks are disposed on a periphery of the integrated circuit.

13. The method according to claim 1, further comprising, when the current measured in at least one first or one second track is higher than the first threshold, injecting an additional current into at least one third track located in the interconnect region, in a manner such as to heat at least a portion of the integrated circuit in order to evaporate the moisture.

14. The method according to claim 13, wherein injecting the additional current into the third track occurs during a time period.

15. The method according to claim 13, wherein applying the potential difference, measuring the current, comparing and injecting the current is repeated as long as the measured current is higher than the first threshold.

16. The method according to claim 15, wherein repeating is performed as long as the measured current is higher than the first threshold and a number of repetitions is fewer than a certain number of attempts.

17. The method according to claim 13, wherein the at least one third track located in the interconnect region is located in a same metal level as the first and second tracks.

18. The method according to claim 13, wherein the at least one third track located in the interconnect region is located in a different metal level as the first and second tracks in a manner such as to heat at least a portion of the integrated circuit in order to evaporate the moisture.

19. The method according to claim 1, further comprising, when the current measured in at least one first or one second track is higher than said first threshold, injecting a supplemental current into the first and/or second tracks during a time period in a manner such as to heat at least a portion of the integrated circuit in order to evaporate the moisture.

20. The method according to claim 19, wherein applying the potential difference, measuring the current, comparing and injecting the current is repeated as long as the measured current is higher than the first threshold.

21. The method according to claim 20, wherein repeating is performed as long as the measured current is higher than the first threshold and a number of repetitions is fewer than a certain number of attempts.

22. The method according to claim 1, further comprising, when the current measured in at least one first or one second track is higher than the first threshold, activating a heating device which is thermally coupled to said interconnect portion during a time period in a manner such as to heat a portion of the integrated circuit in order to evaporate the moisture.

23. The method according to claim 22, wherein applying the potential difference, measuring the current, comparing and activating the heating device is repeated as long as the measured current is higher than the first threshold.

24. The method according to claim 23, wherein repeating is performed as long as the measured current is higher than the first threshold and a number of repetitions is fewer than a certain number of attempts.

25. An integrated circuit, comprising:
a detection circuit configured to detect moisture that is present in an interconnect region of an integrated circuit;
wherein detecting is carried out autonomously by the integrated circuit itself; and
wherein the interconnect region comprises, in at least one metal level, at least one first track and at least one second track which are separated by a dielectric material; and
wherein the detection circuit comprises:
a potential applying circuit configured to apply at least one potential difference between said at least one first track and said at least one second track;
a current measuring circuit configured to measure at least one current circulating in said at least one first track or said at least one second track, said at least one current being generated in response to said at least one potential difference; and
a comparison circuit that is connected to the current measuring circuit and which is configured to compare said measured at least one current with at least one first threshold to detect presence of moisture which renders said dielectric material less insulating.

26. The integrated circuit according to claim 25, wherein the comparison circuit is further configured to compare said measured at least one current with a second threshold which is higher than the first threshold.

27. The integrated circuit according to claim 26, wherein the detection circuit further comprises a communication circuit configured to:
issue a notification when the measured at least one current is higher than said first threshold; and
issue a notification when the measured at least one current is higher than said second threshold.

28. The integrated circuit according claim 26, wherein each metal level of the interconnect region comprises a first track and a second track, wherein a plurality of the first tracks are connected together in series or in parallel and a plurality of the second tracks are connected together in series or in parallel, wherein the potential applying circuit is configured to apply the potential difference between the plurality of the first tracks and the plurality of the second tracks, and wherein the current measuring circuit is configured to measure the current circulating in the plurality of the first tracks or the plurality of the second tracks.

29. The integrated circuit according to claim 26, wherein each metal level comprises a first track and a second track, wherein one of the first tracks and second tracks is connected to the current measuring circuit, wherein said first tracks are not connected together and wherein said second tracks are not connected together, wherein the potential applying circuit is configured to apply the potential difference between each first track and each second track, and wherein the current measuring circuit is configured to measure current circulating in each first track or second track.

30. The integrated circuit according to claim 26, wherein each metal level comprises a first track connected to the current measuring circuit and a second track, wherein said first tracks are not connected together and wherein a plurality of said second tracks are connected together in series or in parallel, wherein the potential applying circuit is configured to apply the potential difference between each first track and the plurality of said second tracks, and wherein the current measuring circuit is configured to measure current circulating in each first track.

31. The integrated circuit according to claim 26, wherein the potential applying circuit is configured to apply the potential difference continuously between at least one first track and at least one second track.

32. The integrated circuit according to claim 26, wherein the potential applying circuit is configured to apply the potential difference at regular time intervals during a time period between at least one first track and at least one second track.

33. The integrated circuit according to claim 26, wherein the first and second tracks are disposed on a periphery of the integrated circuit.

34. The integrated circuit according to claim 26, further comprising a heating circuit configured to heat at least a portion of the integrated circuit in order to evaporate the moisture when the current measured in at least one first or one second track is higher than said at least one first threshold.

35. The integrated circuit according to claim 34, wherein the heating circuit comprises a current injecting circuit and at least one third track located in the interconnect region, the current injecting circuit being configured to inject an additional current into the third track in a manner such as to heat up the third track by the Joule effect.

36. The integrated circuit according to claim 35, wherein the additional current is injected by the current injecting circuit during a time period.

37. The integrated circuit according to claim 35, wherein the at least one third track is located in the same metal level as the first and second tracks.

38. The integrated circuit according to claim 35, wherein the at least one third track is located above or below the first and second tracks.

39. The integrated circuit according to claim 38, wherein the additional current is injected by the current injecting circuit during a time period.

40. The integrated circuit according to claim 34, wherein the heating circuit comprises a heating device which is thermally coupled to the interconnect portion of the integrated circuit and a control circuit configured to control the heating device.

41. The integrated circuit according to claim 26, wherein the comparison circuit comprises a non-volatile memory containing a reference value for at least one first threshold.

42. The integrated circuit according to claim 26, wherein the integrated circuit is a component of an appliance.

43. The integrated circuit according to claim 34, wherein the heating circuit comprises a current injecting circuit and at least one of said first and/or second tracks, the current injecting circuit being configured to inject an additional current into the at least one of said first and/or second tracks in a manner such as to heat up the at least one of said first and/or second tracks by the Joule effect.

44. The integrated circuit according to claim 43, wherein the additional current is injected by the current injecting circuit during a time period.

* * * * *